(12) United States Patent
Hofmann et al.

(10) Patent No.: US 9,612,521 B2
(45) Date of Patent: Apr. 4, 2017

(54) AMORPHOUS LAYER EXTREME ULTRAVIOLET LITHOGRAPHY BLANK, AND MANUFACTURING AND LITHOGRAPHY SYSTEMS THEREFOR

(71) Applicant: Applied Materials, Inc., Santa Clara, CA (US)

(72) Inventors: Ralf Hofmann, Soquel, CA (US); Kevin Moraes, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 311 days.

(21) Appl. No.: 14/139,371

(22) Filed: Dec. 23, 2013

(65) Prior Publication Data

US 2014/0268081 A1    Sep. 18, 2014

Related U.S. Application Data

(60) Provisional application No. 61/778,351, filed on Mar. 12, 2013.

(51) Int. Cl.
*G03F 1/24* (2012.01)
*G03F 1/22* (2012.01)
(Continued)

(52) U.S. Cl.
CPC ............... *G03F 1/22* (2013.01); *C23C 14/16* (2013.01); *C23C 14/352* (2013.01); *G03F 7/70958* (2013.01)

(58) Field of Classification Search
None
See application file for complete search history.

(56) References Cited

U.S. PATENT DOCUMENTS 5,427,671 A    6/1995   Ahmed
5,645,646 A    7/1997   Beinglass et al.
(Continued)

FOREIGN PATENT DOCUMENTS

JP    2002222764 A    8/2002
WO      9508840 A1    3/1995

OTHER PUBLICATIONS

PCT International Preliminary Report on Patentability in PCT/US2014/025110 dated Sep. 15, 2015, 10 pages.
(Continued)

*Primary Examiner* — Stephen Rosasco
(74) *Attorney, Agent, or Firm* — Servilla Whitney LLC

(57) ABSTRACT

An integrated extreme ultraviolet blank production system includes: a vacuum chamber for placing a substrate in a vacuum; a deposition system for depositing a multi-layer stack without removing the substrate from the vacuum; and a treatment system for treating a layer on the multi-layer stack to be deposited as an amorphous metallic layer. A physical vapor deposition chamber for manufacturing an extreme ultraviolet mask blank includes: a target, comprising molybdenum alloyed with boron. An extreme ultraviolet lithography system includes: an extreme ultraviolet light source; a mirror for directing light from the extreme ultraviolet light source; a reticle stage for placing an extreme ultraviolet mask blank with a multi-layer stack having an amorphous metallic layer; and a wafer stage for placing a wafer. An extreme ultraviolet blank includes: a substrate; a multi-layer stack having an amorphous metallic layer; and capping layers over the multi-layer stack.

22 Claims, 3 Drawing Sheets

(51) Int. Cl.
*C23C 14/35* (2006.01)
*G03F 7/20* (2006.01)
*C23C 14/16* (2006.01)

(56) References Cited

U.S. PATENT DOCUMENTS

| | | | |
|---|---|---|---|
| 6,010,916 A | 1/2000 | Horton et al. | |
| 6,142,641 A | 11/2000 | Cohen et al. | |
| 6,202,318 B1 | 3/2001 | Guldi et al. | |
| 6,224,638 B1 | 5/2001 | Jevtic et al. | |
| 6,656,643 B2 | 12/2003 | Gupta et al. | |
| 6,780,496 B2 | 8/2004 | Bajt et al. | |
| 7,001,788 B2 | 2/2006 | Leon et al. | |
| 7,005,227 B2 | 2/2006 | Yueh et al. | |
| 7,186,630 B2 | 3/2007 | Todd | |
| 7,279,252 B2 | 10/2007 | Aschke et al. | |
| 7,282,318 B2 | 10/2007 | Jung | |
| 7,541,297 B2 | 6/2009 | Mallick et al. | |
| 7,736,820 B2 | 6/2010 | Van Herpen et al. | |
| 7,867,923 B2 | 1/2011 | Mallick et al. | |
| 7,892,719 B2 | 2/2011 | Hannah | |
| RE42,388 E | 5/2011 | Summers | |
| 7,960,077 B2 | 6/2011 | Ikuta et al. | |
| 8,465,903 B2 | 6/2013 | Weidman et al. | |
| 8,524,382 B2 | 9/2013 | Ogimoto | |
| 8,536,068 B2 | 9/2013 | Weidman et al. | |
| 8,562,794 B2 | 10/2013 | Kageyama | |
| 2001/0019803 A1* | 9/2001 | Mirkanimi | B82Y 10/00 430/5 |
| 2002/0015855 A1 | 2/2002 | Sajoto et al. | |
| 2003/0176079 A1 | 9/2003 | Sogard | |
| 2004/0009410 A1 | 1/2004 | Lercel et al. | |
| 2004/0029041 A1 | 2/2004 | Shih et al. | |
| 2004/0091618 A1 | 5/2004 | Park et al. | |
| 2004/0151988 A1 | 8/2004 | Silverman | |
| 2005/0008864 A1 | 1/2005 | Ingen Schenau et al. | |
| 2005/0009175 A1 | 1/2005 | Bergh et al. | |
| 2005/0064298 A1 | 3/2005 | Silverman | |
| 2005/0084773 A1 | 4/2005 | Krauth | |
| 2005/0085042 A1 | 4/2005 | Chun et al. | |
| 2005/0199830 A1 | 9/2005 | Bowering et al. | |
| 2005/0266317 A1 | 12/2005 | Gallagher et al. | |
| 2006/0166108 A1 | 7/2006 | Chandrachood et al. | |
| 2006/0245057 A1 | 11/2006 | Van Herpen et al. | |
| 2006/0275547 A1 | 12/2006 | Lee et al. | |
| 2007/0020903 A1 | 1/2007 | Takehara et al. | |
| 2007/0099414 A1 | 5/2007 | Frohberg et al. | |
| 2007/0117359 A1 | 5/2007 | Todd | |
| 2007/0141257 A1 | 6/2007 | Takahashi et al. | |
| 2007/0187228 A1 | 8/2007 | Nozawa et al. | |
| 2007/0240453 A1 | 10/2007 | Uno et al. | |
| 2008/0076252 A1 | 3/2008 | Kon | |
| 2008/0113303 A1 | 5/2008 | Silverman | |
| 2008/0123073 A1 | 5/2008 | Shiraishi et al. | |
| 2009/0031953 A1 | 2/2009 | Ingle et al. | |
| 2009/0091752 A1 | 4/2009 | Terasawa et al. | |
| 2009/0176367 A1 | 7/2009 | Baks et al. | |
| 2009/0278233 A1 | 11/2009 | Pinnington et al. | |
| 2010/0133092 A1 | 6/2010 | Mashimo et al. | |
| 2011/0117726 A1 | 5/2011 | Pinnington et al. | |
| 2011/0305978 A1* | 12/2011 | Iwashita | G03F 1/46 430/5 |
| 2012/0099065 A1 | 4/2012 | Jang | |
| 2012/0129083 A1 | 5/2012 | Yoshimori et al. | |
| 2012/0141923 A1 | 6/2012 | Deweerd | |
| 2012/0145534 A1 | 6/2012 | Kageyama | |
| 2012/0147353 A1 | 6/2012 | Lafarre et al. | |
| 2013/0094009 A1 | 4/2013 | Lafarre et al. | |
| 2013/0157177 A1* | 6/2013 | Yu | G03F 1/24 430/5 |
| 2014/0256129 A1 | 9/2014 | Lai et al. | |

OTHER PUBLICATIONS

PCT International Preliminary Report on Patentability in PCT/US2014/025116 dated Sep. 15, 2015, 9 pages.
PCT International Preliminary Report on Patentability in PCT/US2014/025124 dated Sep. 15, 2015, 8 pages.
PCT International Preliminary Report on Patentability in PCT/US2014/026826 dated Sep. 15, 2015, 7 pages.
International Search Report & Written Opinion for PCT App No. PCT/US2014/25110 dated Jul. 22, 2014.
International Search Report & Written Opinion for PCT App No. PCT/US2014/025116 dated Jul. 22, 2014.
International Search Report & Written Opinion for PCT App No. PCT/US2014/025124 dated Jul. 24, 2014.
International Search Report & Written Opinion for PCT App No. PCT/US2014/26826 dated Jul. 15, 2014.
International Search Report & Written Opinion for PCT App No. PCT/US2014/026844 dated Sep. 3, 2014.
U.S. Appl. No. 14/139,307, filed Dec. 23, 2013, Beasley et al.
U.S. Appl. No. 14/139,415, filed Dec. 23, 2013, Hofmann et al.
U.S. Appl. No. 14/139,457, filed Dec. 23, 2013, Michaelson et al.
U.S. Appl. No. 14/139,507, filed Dec. 23, 2013, Barman et al.
Final Office Action in U.S. Appl. No. 14/139,457 dated Jul. 22, 2016, 16 pages.
Final Office Action in U.S. Appl. No. 14/139,415 dated Oct. 7, 2016, 31 pages.

\* cited by examiner

AMORPHOUS LAYER EXTREME ULTRAVIOLET LITHOGRAPHY BLANK, AND MANUFACTURING AND LITHOGRAPHY SYSTEMS THEREFOR

CROSS-REFERENCE TO RELATED APPLICATION(S)

This application claims the benefit of U.S. Provisional Patent Application Ser. No. 61/778,351 filed Mar. 12, 2013, and the subject matter thereof is incorporated herein by reference thereto.

The present application contains subject matter related to a concurrently filed U.S. patent application Ser. No. 14/139,307 filed Dec. 23, 2013. The related application is assigned to Applied Materials, Inc. and the subject matter thereof is incorporated herein by reference thereto.

The present application contains subject matter related to a concurrently filed U.S. patent application Ser. No. 14/139,415 filed Dec. 23, 2013. The related application is assigned to Applied Materials, Inc. and the subject matter thereof is incorporated herein by reference thereto.

The present application contains subject matter related to a concurrently filed U.S. patent application Ser. No. 14/139,457 filed Dec. 23, 2013. The related application is assigned to Applied Materials, Inc. and the subject matter thereof is incorporated herein by reference thereto.

The present application contains subject matter related to a concurrently filed U.S. patent application Ser. No. 14/139,507 filed Dec. 23, 2013. The related application is assigned to Applied Materials, Inc. and the subject matter thereof is incorporated herein by reference thereto.

TECHNICAL FIELD

The present invention relates generally to extreme ultraviolet lithograph blanks, and manufacturing and lithography systems for such extreme ultraviolet lithograph blanks.

BACKGROUND

Extreme ultraviolet lithography (EUV, also known as soft x-ray projection lithography) is a contender to replace deep ultraviolet lithography for the manufacture of 0.13 micron, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within a extremely narrow ultraviolet bandpass; e.g., 12 to 14 nanometer bandpass for 13 nanometer ultraviolet light.

There are various classes of defects in semiconductor processing technology which cause problems. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. And phase defects are typically caused by scratches and surface variations beneath the multilayer coatings which cause transitions in the phase of the reflected light. These phase transitions result in light wave interference effects which distort or alter the pattern that is to be exposed in the resist on the surface of the semiconductor wafer. Because of the shorter wavelengths of radiation which must be used for sub-0.13 micron minimum feature size, scratches and surface variations which were insignificant before now become intolerable.

While progress has been made in reducing or eliminating particle defects and work has been done on repair of opaque and clear defects in masks, to date nothing has been done to address the problem of phase defects. For deep ultraviolet lithography, surfaces are processed to maintain phase transitions below 60 degrees. Similar processing for extreme ultraviolet lithography is yet to be developed.

For an actinic wavelength of 13 nanometers, a 180 degree phase transition in the light reflected from the multilayer coating may occur for a scratch of as little as 3 nanometers in depth in the underlying surface. This depth gets shallower with shorter wavelengths. Similarly, at the same wavelength, surface variations more abrupt than one (1) nanometer rise over one hundred (100) nanometers run may cause similar phase transitions. These phase transitions can cause a phase defect at the surface of the semiconductor wafer and irreparably damage the semiconductor devices.

In the past, mask blanks for deep ultraviolet lithography have generally been of glass but silicon or ultra low thermal expansion materials have been proposed as alternatives for extreme ultraviolet lithography. Whether the blank is of glass, silicon, or ultra low thermal expansion material, the surface of the mask blank is made as smooth as possible by such processes a chemical mechanical polishing, magnetorheological finishing, or ion beam polishing. The scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography the pattern masks used must be reflective mask instead of the transmissive masks used in current lithography. The reflective mask is made up of a precise stack of alternating thin layers of molybdenum and silicon, which creates a Bragg refractor or mirror. Because of the nature of the multilayer stack and the small feature size, any imperfections in the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack.

Mask blanks are a critical item for the adoption of EUV lithography. The main hurdles relate to defectivity and the reflectance of the mask blank. The mask has a Bragg reflector of 80 alternating layers of molybdenum (Mo) and silicon (Si) deposited on it. The roughness of this layer stack is critical and relates to line edge roughness on the printed wafer.

The need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an integrated extreme ultraviolet blank production system includes: a vacuum chamber for placing a substrate in a vacuum; a deposition system for depositing a multi-layer stack without removing the substrate from the vacuum; and a treatment system for treating a layer on the multi-layer stack to be deposited as an amorphous metallic layer.

An embodiment of the present invention provides a physical vapor deposition chamber for manufacturing extreme ultraviolet mask blanks includes: a target, comprising molybdenum alloyed with boron.

An embodiment of the present invention provides an extreme ultraviolet lithography system includes: an extreme ultraviolet light source; a mirror for directing light from the extreme ultraviolet light source; a reticle stage for placing an extreme ultraviolet mask blank with a multi-layer stack having an amorphous metallic layer; and a wafer stage for placing a wafer.

An embodiment of the present invention provides an extreme ultraviolet blank includes: a substrate; a multi-layer stack having an amorphous metallic layer; and capping layers over the multi-layer stack.

Certain embodiments of the invention have other elements in addition to or in place of those mentioned above. The steps or element will become apparent to those skilled in the art from a reading of the following detailed description when taken with reference to the accompanying drawings.

DETAILED DESCRIPTION

Figure 1:
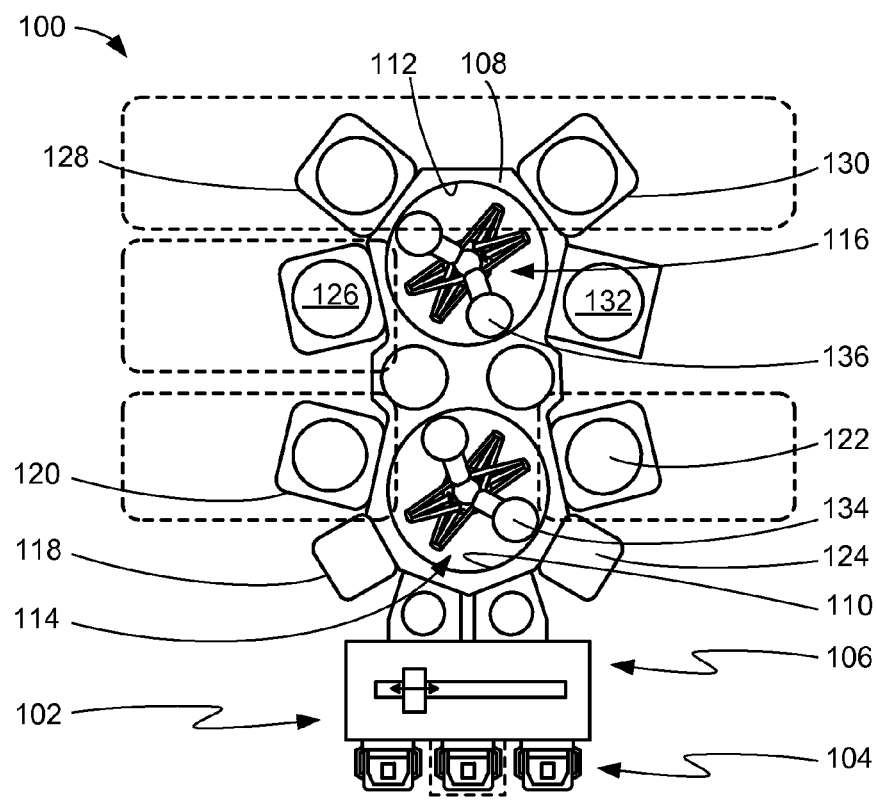
FIG. 1 is an integrated extreme ultraviolet (EUV) mask production system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Embodiments of the present invention use various established techniques for depositing silicon, silicon oxide, and related layers of compatible thermal expansion coefficient by CVD, PVD, ALD, and flowable CVD to fill the pits and bury the defects. Once deposited, the layer's surface maybe smooth and flat enough for further multilayer stack deposition, or may then be smoothed further using a variety of established smoothing or polishing techniques, including CMP, annealing, or ion beam polishing.

Referring now to FIG. 1, therein is shown an integrated extreme ultraviolet (EUV) mask blank production system 100. The integrated EUV mask blank production system 100 includes a mask blank loading and carrier handling system 102 into which mask blanks 104 are loaded. An airlock 106 provides access to a wafer handling vacuum chamber 108. In the embodiment shown, the wafer handling vacuum chamber 108 contains two vacuum chambers, a first vacuum chamber 110 and a second vacuum chamber 112. Within the first vacuum chamber 110 is a first wafer handling system 114 and in the second vacuum chamber 112 is a second wafer handling system 116.

The wafer handling vacuum chamber 108 has a plurality of ports around its periphery for attachment of various other systems. The first vacuum chamber 110 has a degas system 118, a first physical vapor deposition system 120, a second physical vapor deposition system 122, and a preclean system 124.

The second vacuum chamber 112 may have various treatment systems, such as a first multi-cathode source 126, a flowable chemical vapor deposition (FCVD) system 128, a cure system 130, and a second multi-cathode source 132, connected to it.

The first wafer handling system 114 is capable of moving wafers, such as a wafer 134, among the airlock 106 and the various systems around the periphery of the first vacuum chamber 110 and through slit valves in a continuous vacuum. The second wafer handling system 116 is capable of moving wafers, such as a wafer 136, around the second vacuum chamber 112 while maintaining the wafers in a continuous vacuum.

Figure 2:
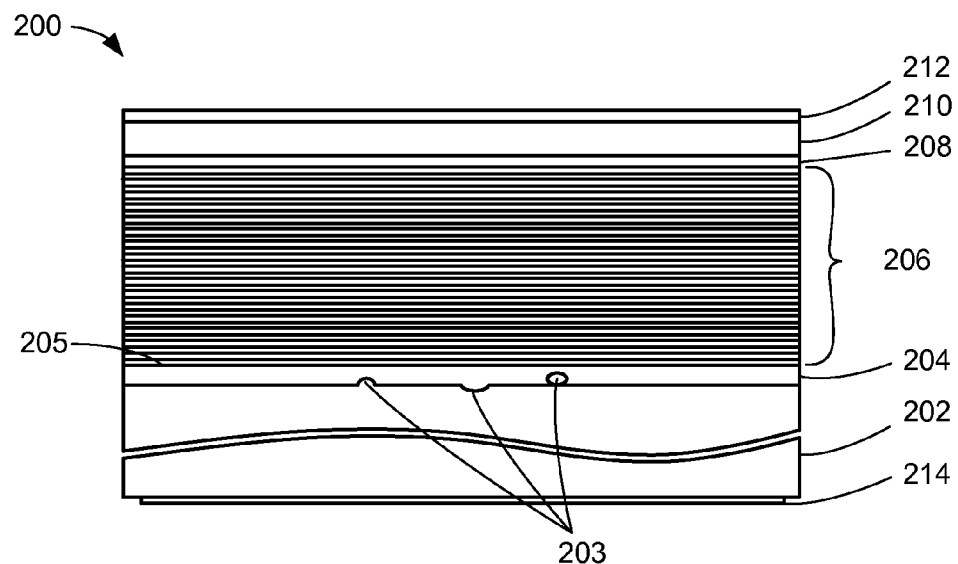
FIG. 2 is a EUV mask blank in accordance with an embodiment of the present invention.

Referring now to FIG. 2, therein is shown a EUV mask blank 200 in accordance with an embodiment of the present invention. The EUV mask blank 200 has an ultra-low thermal expansion substrate 202 of glass, silicon, or other ultra-low thermal expansion material. The ultra-low thermal expansion materials include fused silica, fused quartz, calcium fluoride, silicon carbide, silicon oxide-titanium oxide alloy, or other material having a thermal coefficient of expansion within the range of these materials.

The top surface of the ultra-low expansion substrate 202 has imperfections 203, such as pits, scratches, and particles, which result from chemical mechanical polishing (CMP) with an abrasive. The scratches that are left behind in such a process are sometimes referred to as "pits" and/or "scratch-dig" marks, and their depth and width depend upon the size of the particles in the abrasive used to polish the EUV mask blank 200.

It has been discovered that the imperfections in the EUV mask blank 200 can be eliminated by deposition of a planarization layer 204. The planarization layer 204, or flowable film, can be formed by depositing a flowable CVD film or depositing silicon, silicon oxide, or related films by CVD, PVD, or similar processes over the ultra-low expansion substrate 202. This step buries particles and other defects that are on the ultra-low expansion substrate 202.

In the case of flowable CVD films, no further processing may be required to achieve an acceptably smooth, flat surface 205 over the ultra-low expansion substrate 202. For silicon, silicon oxide, or related films, smoothing after deposition may be required. This smoothing can be done by a variety of polishing methods including, but not limited to CMP, chemical polishing, ion beam polishing or annealing. These smoothing techniques can also be applied to the flowable CVD film if further smoothing is required.

A multi-layer stack 206 is formed above the planarization layer 204 to form a Bragg reflector. Due to the transmissive nature of the optics and illuminating wavelengths used in EUV, reflective optics are used and the multi-layer stack 206 may be made of alternating layers of high-Z and low-Z materials, such as molybdenum and silicon, which form a reflector.

A capping layer 208 is formed above the multi-layer stack 206. The capping layer can be a material such as ruthenium (Ru) or a non-oxidized compound thereof to help protect the multi-layer stack 206 from oxidation and any chemical etchants to which the EUV mask blank 200 may be exposed during mask processing. Other material such as titanium nitride, boron carbide, silicon nitride, ruthenium oxide, and silicon carbide may also be used in the capping layer 208.

An absorber layer 210 is placed over the capping layer 208. The absorber layer 210 is of a material having a high absorption coefficient for a particular frequency of EUV light (about 13.5 nm) and may be a material such chromium, tantalum or nitrides thereof.

An anti-reflective coating (ARC) 212 is deposited over the absorber layer 210. The ARC 212 can be of a material such as tantalum oxynitride or tantalum boron oxide.

A backside chucking layer 214 is formed over the rear surface of the ultra-low expansion substrate 202 for chucking the substrate on or with an electrostatic chuck (not shown).

Figure 3:
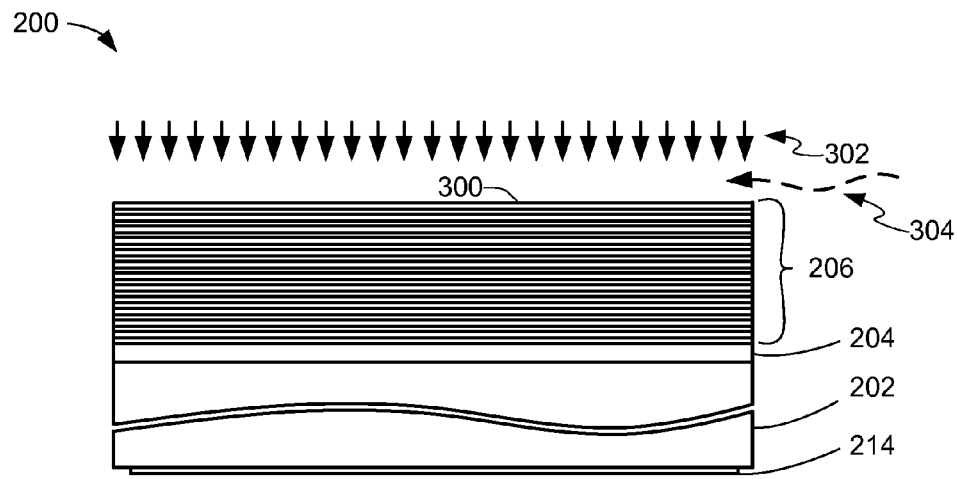
FIG. 3 is the EUV mask blank in an intermediate stage of manufacture.

Referring now to FIG. 3, therein is shown the EUV mask blank 200 in an intermediate stage of manufacture.

During deposition of the multi-layer stack 206, the metallic layer 300 can be alloyed. It has been discovered that an alloyed deposition 302 can prevent the metallic layer 300 from being deposited as a polycrystalline layer. Instead, the metallic layer 300 can be maintained as an amorphous metallic layer 300.

For example, the alloyed deposition 302 can be performed in the second vacuum chamber 112 of FIG. 1 where the first multi-cathode source 126 is a boron alloyed molybdenum target and the second multi-cathode source 132 is a silicon target. The first multi-cathode source 126 and the second multi-cathode source 132 are angled with respect to a rotatable pedestal adapted to receive the substrate 202. Boron alloying will maintain the molybdenum in an amorphous state. By maintaining an amorphous phase in the metallic layer 300, the overall roughness of the multi-layer stack 206 is improved by having better EUV reflectivity with less flare than without the molybdenum in the amorphous state.

In an alternative method, it has been discovered that a gas 304, such as nitrogen, can be added to the sputter gas to disrupt the structure of the deposited molybdenum to also form an amorphous phase in the metallic layer 300.

Figure 4:
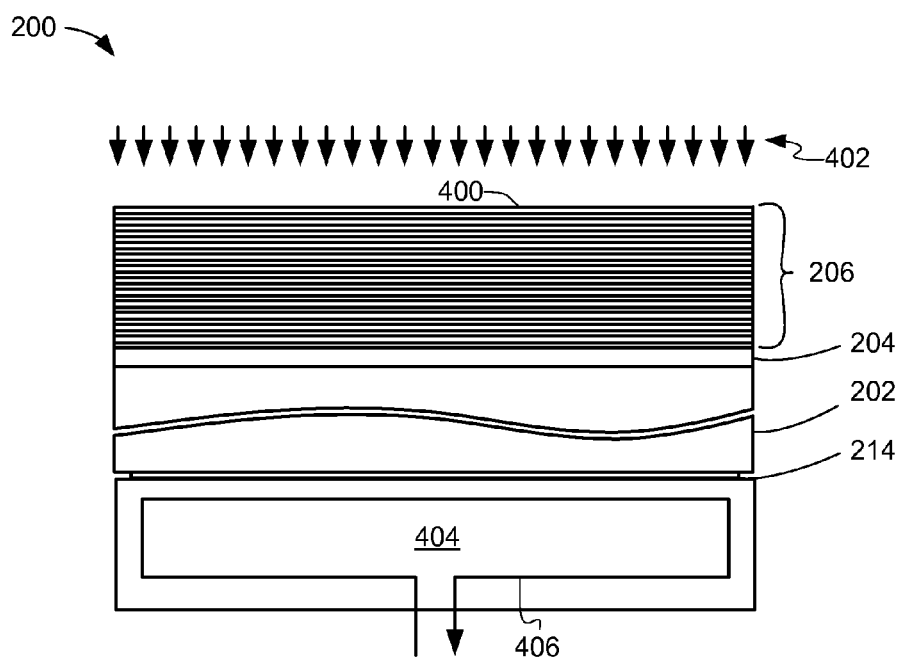
FIG. 4 is the EUV mask blank in an intermediate stage of manufacture.

Referring now to FIG. 4, therein is shown the EUV mask blank 200 in an intermediate stage of manufacture. The EUV mask blank 200 is held on a treatment system, such as an electrostatic chuck 404 with cooling passages 406. The electrostatic chuck 404 is the rotatable pedestal adapted to receive the substrate 202.

An ion beam, plasma, or magnetron sputtering tool 132 is used to deposit the multi-layer stack over the substrate. The silicon layer is deposited as an amorphous layer, while the molybdenum layer is polycrystalline. This morphology causes higher surface roughness of the molybdenum layer which then propagates through the stack. To achieve the required smoothness of the film stack ion beam polishing is at times employed to decrease roughness. This is a cumbersome process flow that does not meet the productivity requirements.

It has been shown in Magnetic RAM (MRAM) that B-alloying can prevent a CoFe layer from depositing as a polycrystalline layer. The B-alloyed layer also exhibits lower roughness.

It has been found that the same concept may be applied to the molybdenum deposition by using an alloyed molybdenum target. By maintaining an amorphous phase in the molybdenum layer the overall roughness of the multi-layer stack improves and leads to better EUV reflectivity with less flare. Examples of such alloying materials are boron and carbon. Another possibility is to add a small amount of nitrogen to the sputter gas to disrupt the structure of the deposited molybdenum.

Another technique that has been found that can be employed to suppress grain growth in the molybdenum layer is to cool the substrate to low temperatures. This can be accomplished by pre-cooling the substrate prior to deposition and actively cooling the substrate during the deposition process using water or gas cooling.

By maintaining an amorphous phase in the molybdenum layer the overall roughness of the multi-layer stack is improved and leads to better EUV reflectivity with less flare. An example of such alloying is boron. Another possibility is to add a small amount of nitrogen to the sputter gas to disrupt the structure on the deposited molybdenum layer.

Another technique that can be employed to suppress grain growth in the molybdenum layer is to cool the substrate to low temperatures. This can be accomplished by pre-cooling the substrate prior to deposition and actively cooling the substrate during the deposition process.

The resulting method and system is straightforward, cost-effective, uncomplicated, highly versatile and effective, can be surprisingly and unobviously implemented by adapting known technologies, and are thus readily suited for efficiently and economically manufacturing EUV mask blanks.

An advantage of this method is that it is substrate independent and so it can be used on a variety of substrates and qualities of substrates. It has the potential to make it possible to use glass substrates that have the required properties for EUV blanks but do not have atomically flat, smooth surfaces after polishing. This independence makes it possible to use different substrate suppliers and minimizes the impact of unexpected changes to the substrate preparation and polishing by the suppliers.

Embodiments of the invention provide an atomically flat, low defect, smooth surface for an EUV mask blank. However, embodiments of the invention could also be used to manufacture other types of blanks, such as for mirrors. Over a glass substrate, embodiments of the invention can be used to form an EUV mirror. Further, embodiments of the invention can be applied to other atomically flat, low defect, smooth surface structures used in UV, DUV, e-beam, visible, infrared, ion-beam, x-ray, and other types of semiconductor lithography. Embodiments of the invention can also be used in various size structures that can range from wafer-scale to device level and even to larger area displays and solar applications.

Another important aspect of the present invention is that it valuably supports and services the historical trend of reducing costs, simplifying systems, and increasing performance.

These and other valuable aspects of the present invention consequently further the state of the technology to at least the next level.

It has been discovered that an amorphous phase can be formed in the metallic layer 400 by cooling the ultra-low expansion substrate 202 during deposition of the multilayer stack 206. The cooling of the multi-layer stack 206 suppresses grain growth in the molybdenum layer. This grain growth is suppressed by precooling the ultra-low expansion substrate 202 and actively cooling the ultra-low expansion substrate 202 during the deposition process using water.

Figure 5:
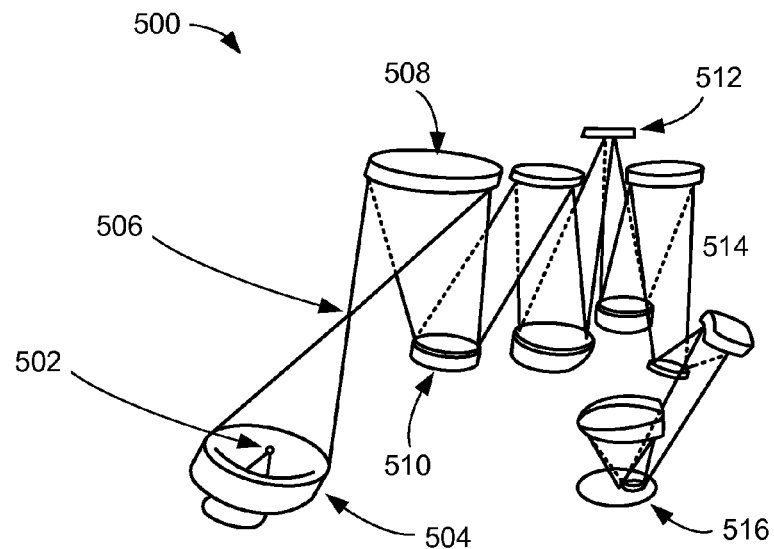
FIG. 5 is an optical train for a EUV lithography system.

Referring now to FIG. 5, therein is shown an optical train 500 for a EUV lithography system. The optical train 500 has a plasma source 502 for creating the EUV light and collecting it in a collector 504. The collector 504 provides the light to a field facet mirror 508 which is part of an illuminator system 506 which further includes a pupil facet mirror 510. The illuminator system 506 provides the EUV light to a reticle 512 (which is the fully processed version of the mask blank 104 of FIG. 1), which reflects the EUV light through projection optics 514 and onto a wafer 516.

Figure 6:
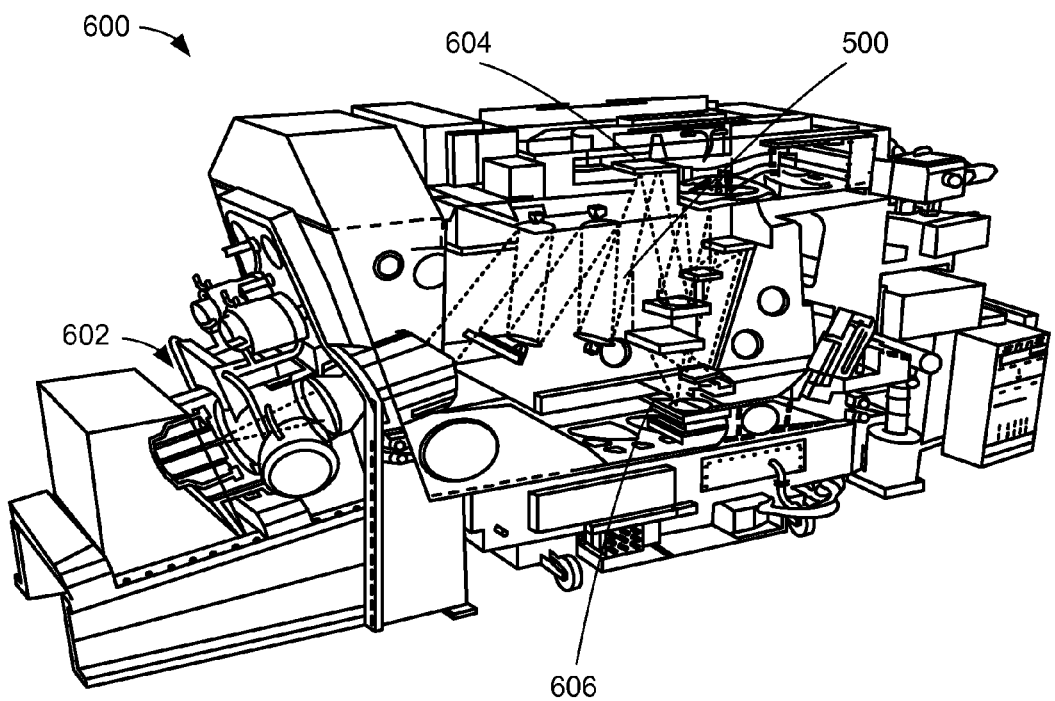
FIG. 6 is a EUV lithography system.

Referring now to FIG. 6, therein is shown a EUV lithography system 600. The EUV lithography system 600 includes a EUV light source area 602, a reticle stage 604 and a wafer stage 606 as adjuncts to the optical train 600. The reticle stage 604 supports the reticle 512 of FIG. 5, which is the fully processed version of the mask blank 104 of FIG. 1.

It has been found that the EUV mirror 508 and the EUV mask blank 104 permit the EUV lithography system 600 to overcome many of the hurdles facing the production of ultra-miniaturized integrated circuits on die and wafers.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An extreme ultraviolet blank comprising:
   a substrate;
   a multi-layer stack having an amorphous metallic layer over the substrate, the multi-layer stack reflective of extreme ultraviolet light;
   a capping layer over the multi-layer stack; and
   an absorber layer which absorbs extreme ultraviolet light, the absorber layer over the capping layer.

2. The blank as claimed in claim 1 wherein the amorphous metallic layer is an alloyed amorphous metallic layer.

3. The blank as claimed in claim 1 wherein the amorphous metallic layer is alloyed with boron, nitrogen, or carbon.

4. The blank as claimed in claim 1 wherein the amorphous metallic layer is amorphous molybdenum.

5. The blank as claimed in claim 1 wherein the amorphous metallic layer has a disrupted crystalline structure.

6. The blank as claimed in claim 1 wherein the amorphous metallic layer has suppressed grain growth.

7. The blank as claimed in claim 1 wherein the multi-layer stack forms an extreme ultraviolet mask blank.

8. The blank as claimed in claim 1 wherein the multi-layer stack forms an extreme ultraviolet mirror.

9. The blank as claimed in claim 1 wherein the substrate is an ultra-low thermal expansion material.

10. The blank as claimed in claim 1 wherein the substrate is a glass.

11. The blank as claimed in claim 1, wherein the multi-layer stack comprises alternating layers of molybdenum and silicon.

12. The blank as claimed in claim 11, further comprising an antireflective coating over the absorber layer.

13. The blank as claimed in claim 11, wherein the capping layer comprises ruthenium and the absorber layer comprises tantalum.

14. The blank as claimed in claim 13, wherein the amorphous metallic layer is an alloyed amorphous metallic layer.

15. The blank as claimed in claim 13, wherein the amorphous metallic layer is alloyed with boron, nitrogen, or carbon.

16. The blank as claimed in claim 15, wherein the amorphous metallic layer is amorphous molybdenum.

17. The blank as claimed in claim 13, wherein the amorphous metallic layer has a disrupted crystalline structure.

18. The blank as claimed in claim 13, wherein the amorphous metallic layer has suppressed grain growth.

19. The blank as claimed in claim 13, wherein the multi-layer stack forms an extreme ultraviolet mask blank.

20. The blank as claimed in claim 13, wherein the multi-layer stack forms an extreme ultraviolet mirror.

21. The blank as claimed in claim 13, wherein the substrate is an ultra-low thermal expansion material.

22. The blank as claimed in claim 13, wherein the substrate is a glass.

* * * * *